United States Patent [19]
Thompson et al.

[11] Patent Number: 6,021,049
[45] Date of Patent: Feb. 1, 2000

[54] PCI AND ISA ADAPTER CARD GUIDE PINCHER

[75] Inventors: Donald L. Thompson, Austin; Roy A. Rachui, Georgetown, both of Tex.

[73] Assignee: International Business Machines Corporation, Armonk, N.Y.

[21] Appl. No.: 09/035,260

[22] Filed: Mar. 5, 1998

[51] Int. Cl.[7] .............................. H05K 5/00; H01R 13/62
[52] U.S. Cl. .................... 361/759; 361/683; 361/753; 361/754; 361/801; 361/802; 361/825; 211/41.17; 439/62; 439/160
[58] Field of Search .................... 361/726, 732, 361/740, 756, 759, 741, 752, 736, 801, 802, 798, 807, 808, 683; 211/41.17; 312/331, 333, 223.2; 292/172; 74/527, 533, 534; 248/221.11, 292.12; 439/62, 160

[56] References Cited

U.S. PATENT DOCUMENTS

| | | |
|---|---|---|
| 4,574,332 | 3/1986 | Calabro .............................. 361/802 X |
| 5,010,426 | 4/1991 | Krenz .................................. 361/726 X |
| 5,036,481 | 7/1991 | Lunsford et al. . |
| 5,162,675 | 11/1992 | Olsen et al. . |
| 5,163,833 | 11/1992 | Olsen et al. . |
| 5,383,793 | 1/1995 | Hsu et al. .............................. 439/327 |
| 5,544,006 | 8/1996 | Radloff et al. ...................... 361/802 X |
| 5,594,627 | 1/1997 | Le .......................................... 361/801 |
| 5,611,057 | 3/1997 | Pecone et al. . |
| 5,754,406 | 5/1998 | Hardt et al. ............................. 361/756 |

*Primary Examiner*—Leo P. Picard
*Assistant Examiner*—Jayprakash N. Gandhi
*Attorney, Agent, or Firm*—Volel Emile; Michael E. Noe; Andrew J. Dillon

[57] ABSTRACT

A retention device for retaining the forward edge of a PCI or ISA adapter card in a computer frame is provided. The retention device has a channel mounted to the frame opposite a rearward edge of the card. The channel has upper and lower panels which define a slot for receiving the forward edge of the card. A finger is pivotally mounted to one end of the channel and has grooves on a lower surface for engaging grooves on an upper surface of the forward edge. The finger is movable between an engaged position for capturing the forward edge to retain it from moving, and a disengaged position for releasing the forward edge and allowing the card to be removed from the slot.

16 Claims, 3 Drawing Sheets

PCI AND ISA ADAPTER CARD GUIDE PINCHER

TECHNICAL FIELD

This invention relates in general to mechanical connectors for computer cards and in particular to a mechanism for securing PCI and ISA adapter cards to the frame of a computer.

BACKGROUND ART

Many computers utilize Peripheral Component Interconnect (PCI) or Industry Standard Architecture (ISA) adapter cards. These cards have electrical connectors along their longitudinal edges and are mounted to the frame of the computer along their forward and rearward edges. During shipping, the PCI or ISA adapter cards must be secured from movement to prevent them from electrically disconnecting from the connector on the motherboard or a riser card.

Currently, each full length PCI or ISA adapter card is mounted to the frame of the computer by sliding a forward edge of the card into a card guide groove. A PCI card is slightly shorter in length than an ISA adapter card and requires a card extender bracket to be mounted to its forward edge to reach and properly engage the card guide groove. Although the forward edge or card extender bracket of the card is closely received by the card guide groove, there is some inherent mechanical lash between these components.

A back bracket is mounted to the rearward edge of the card. After the card is positioned within the card guide groove, a screw is inserted through the back bracket and fastened to the computer frame to rigidly hold the rearward edge of the card in position. However, the back bracket is located too far away from the forward edge to prevent the forward edge from moving during shipping. As a result, the back bracket essentially acts as a pivot point for the forward edge.

This lack of secure mechanical attachment at the forward edge may allow the card to shift during shipping and partially disconnect or unplug the electrical connector along the card's longitudinal edge from the motherboard connector. In addition, fretting corrosion of gold adapter card tabs located along the interface between the electrical connector of the card and the motherboard connector is a problem. These problems can result in a functional failure. A mechanical apparatus and/or method of limiting movement between the forward edge of the card and the card guide groove is needed.

DISCLOSURE OF THE INVENTION

A retention device for retaining the forward edge of a PCI or ISA adapter card in a computer frame is provided. The retention device has a channel mounted to the frame opposite a rearward edge of the card. The channel has upper and lower panels which define a slot for receiving the forward edge of the card. A finger is pivotally mounted to one end of the channel and has grooves on a lower surface for engaging grooves on an upper surface of the forward edge of an ISA card or the extender bracket of a PCI card. The finger is movable between an engaged position for capturing the forward edge to retain it from moving, and a disengaged position for releasing the forward edge and allowing the card to be removed from the slot.

BEST MODE FOR CARRYING OUT THE INVENTION

Figure 1:
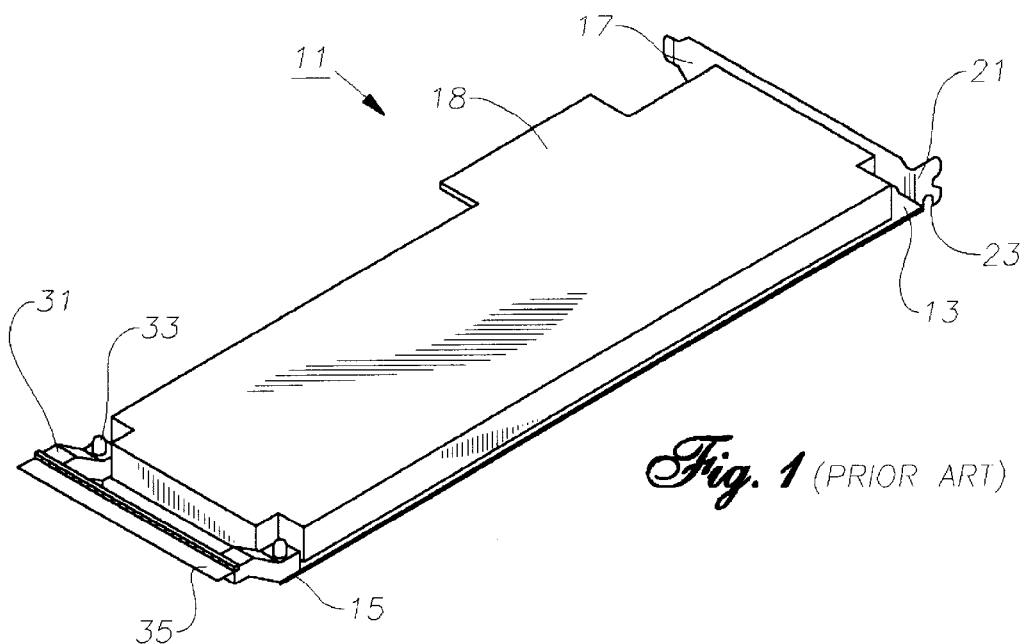
FIG. 1 is a schematic isometric view of a prior art PCI card.
Figure 2:
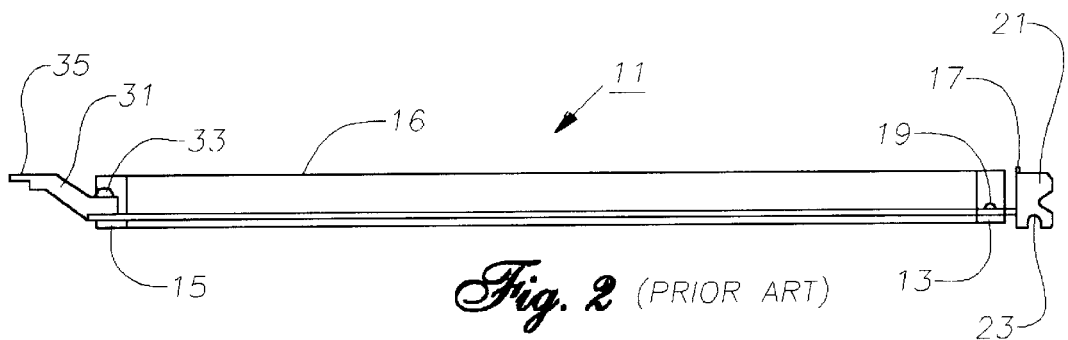
FIG. 2 is a schematic side view of the PCI card of FIG. 1.

Referring to FIGS. 1 and 2, a conventional, generally rectangular Peripheral Component Interconnect (PCI) card 11 having a rearward end 13 and a forward end 15 is shown. Electrical components (not shown) are mounted to a surface 16 of PCI card 11. PCI card 11 also has an electrical connector 18 along a longitudinal edge for engaging a motherboard connector. A back bracket 17 is rigidly mounted to rearward end 13 with fasteners 19 (FIG. 2). Back bracket 17 is provided for mounting rearward end 13 to a computer frame (not shown). Back bracket 17 is generally flat in shape and slightly longer than PCI card 11 is wide. Back bracket 17 has a short, rearward extending tab 21 protruding from one end and a screw attachment slot 23 on a lower edge of tab 21. Back bracket 17 is provided for attaching PCI card 11 to the computer frame (not shown).

A card extension bracket 31 is rigidly mounted to forward end 15 of a full length PCI card 11 with fasteners 33. Card extension bracket 31 is provided for adapting the length of PCI card 11 to conventional computer architectural requirements. Card extension bracket 31 inclines upward from a lower side of forward end 15 and is approximately equal in length to the width of PCI card 11. Card extension bracket 31 has a forward edge 35 protruding from its forward end. Forward edge 35 is a short, thin, flat strip that is generally parallel to PCI card 11.

Figure 3:
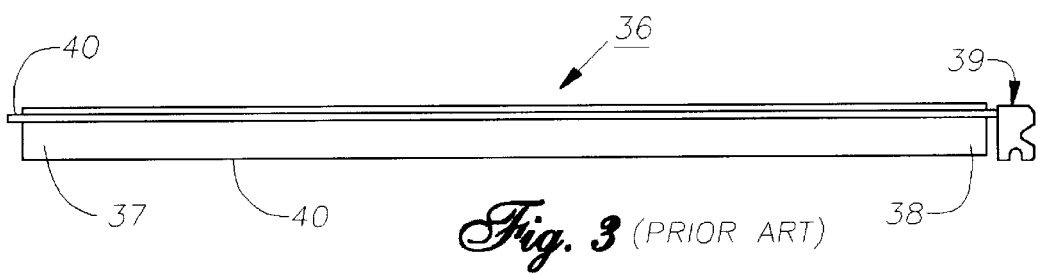
FIG. 3 is a schematic side view of a prior art ISA adapter card.

Referring to FIG. 3, a conventional, generally rectangular Industry Standard Architecture (ISA) card 36 is shown. ISA card 36 is very similar to PCI card 11 and has forward and rearward ends 37, 38 with a back bracket 39 rigidly mounted to rearward end 38. ISA card 36 also has an electrical connector 34 on a longitudinal edge and electrical components (not shown) mounted to its surface 40. A full length ISA card 36 is slightly longer than PCI card 11 and, thus, does not require card extension bracket 31 (FIGS. 1 and 2) to fit conventional computer architectural requirements. ISA card 36 has a forward edge 40 protruding from its forward end. Forward edge 40 is essentially identical to forward edge 35 on PCI card 11.

FIGS. 4–9 show two embodiments of the invention. In each of these Figures, PCI card 11 and ISA card 36 are depicted generically and the reference numerals for ISA card 36 are not utilized for simplification. Hereinafter, the term "card 11" will refer to either PCI card 11 or ISA card 36. Likewise, the reference numerals for the components of card 11 may be applied to either card.

Figure 4:
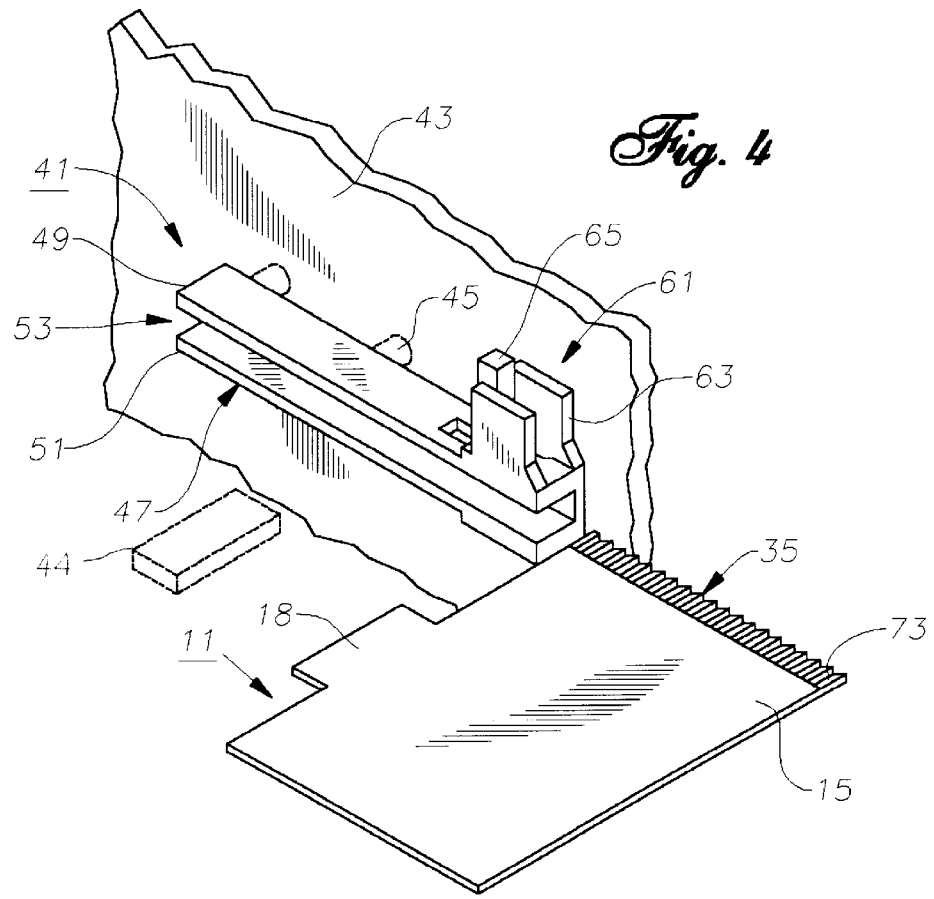
FIG. 4 is a schematic isometric view of a first embodiment of an apparatus constructed in accordance with the invention, shown with an ISA card prior to insertion.
Figures 5, 6:
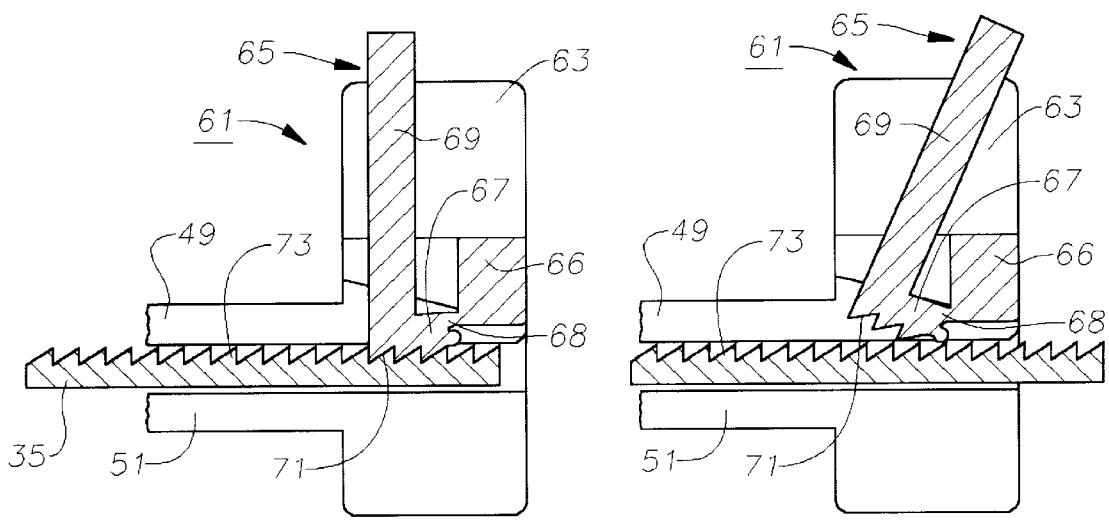
FIG. 5 is an enlarged sectional side view of the apparatus and card of FIG. 4 shown with the card fully inserted and engaged.
FIG. 6 is an enlarged sectional side view of the apparatus and card of FIG. 4 shown with the card fully inserted and disengaged.

Referring now to FIGS. 4–6, a first and preferred embodiment of the invention is shown. A retention mechanism 41 is rigidly mounted to the frame 43 of a computer with fasteners 45 (indicated by dashed lines). Mechanism 41 comprises an elongated brace, strip or channel 47 having an upper panel 49, a lower panel 51 and a shallow card guide groove or slot 53 therebetween. Panels 49, 51 are generally parallel to one another.

Channel 47 has a pinching device 61 integrally formed on one end. As shown in FIGS. 5 and 6, the portions of panels 49, 51 which are adjacent to and comprise elements of pinching device 61 are slightly greater in thickness than their other portions to provide reinforcing strength.

Pinching device 61 has two upright walls 63 and a lever or finger 65 which is closely received therebetween. Walls 63 are integrally formed with panel 49. Finger 65 is mounted to a bridge 66 which extends between walls 69. Finger 65 has a base portion 67 and a lever portion 69. Base portion 67 extends generally horizontally from upper panel 49. A web 68 joins base portion 67 to bridge 66 and acts as a hinge or pivot point for finger 65. Web 68 is rigid but flexible and biases finger 65 to an engaged position (FIG. 5). Lever portion 69 extends generally vertically from base portion 67 while in the engaged position, but may be pivoted to a disengaged position (FIG. 6) by applying a force to the right on lever portion 69. The lower surface of base portion 67 is provided with a series of shallow teeth or grooves 71 which extend across its width.

Referring again to FIG. 4, forward edge 35 of card 11 has a mechanical enhancement on one side. In the preferred embodiment, the mechanical enhancement comprises a plurality of shallow teeth or grooves 73 on an upper side. Grooves 73 extend across the width of forward edge 35 and are generally parallel to grooves 71 on horizontal portion 67. Grooves 73 may be molded into forward edge 35 or added by applying a thin serrated strip (not shown) to its upper side. As shown in FIG. 5, grooves 73 are provided for mating engagement with grooves 71.

As shown in FIGS. 5 and 6, grooves 71 and 73 are oriented so that card 11 is allowed to ratchet into retention mechanism 41 (right to left) without manual manipulation of finger 65. However, finger 65 must be pivoted to the disengaged position to withdraw card 11 (left to right) from retention mechanism 41.

In operation, forward edge 35 of card 11 is positioned adjacent to retention mechanism 41 so that forward edge 35 is aligned between panels 49, 51 (FIG. 4). Forward edge 35 is then inserted into slot 53 (from right to left) until the electrical connector 18 on the lateral edge of card 11 engages the motherboard connector 44 (indicated schematically with dashed lines) in the computer. As shown in FIG. 6, finger 65 will ratchet or pivot up and out of the way of forward edge 35 as forward edge 35 enters slot 53 due to interference between grooves 71, 73. When card 11 is properly positioned, grooves 71, 73 will matingly engage since finger 65 is biased to the engaged position. This allows finger 65 to return to its upright and locked position (FIG. 5). With finger 65 in the engaged position, forward edge 35 and, thus, card 11 will be prevented from moving out (to the right) of slot 53. To reposition or remove card 11 and disconnect electrical connector 18 from motherboard connector 44, finger 65 is pivoted to the right (FIG. 6) so that grooves 71, 73 disengage. Card 11 may then be removed from slot 53 by pulling it to the right.

Figure 7:
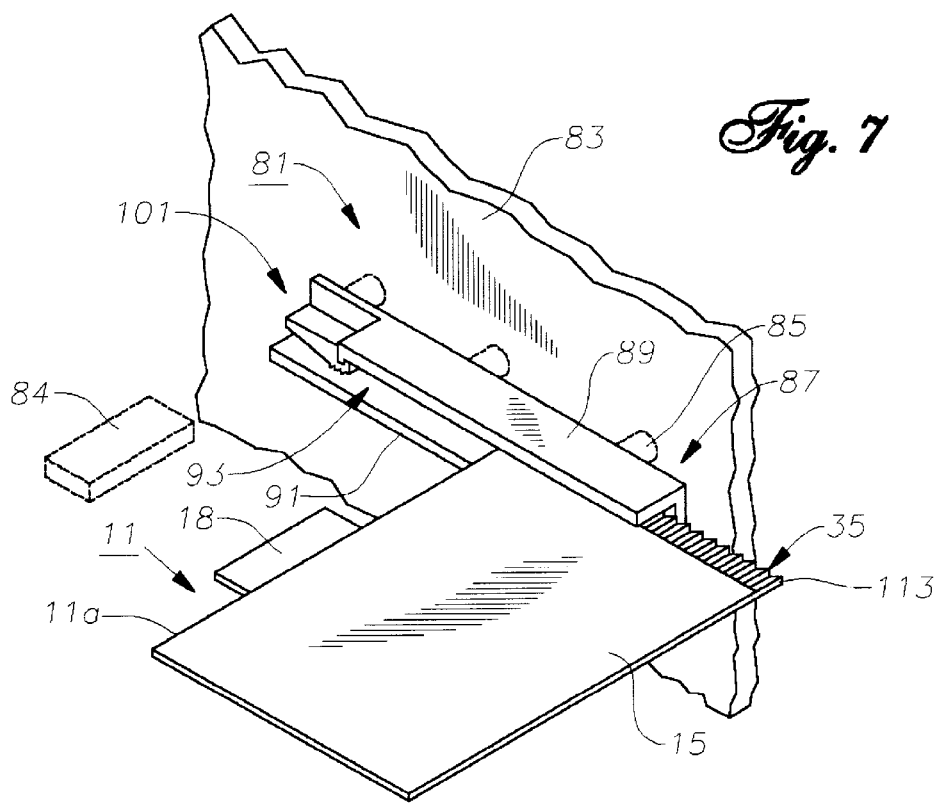
FIG. 7 is an isometric view of a second embodiment of an apparatus constructed in accordance with the invention, shown with an ISA card partially inserted.
Figures 8, 9:
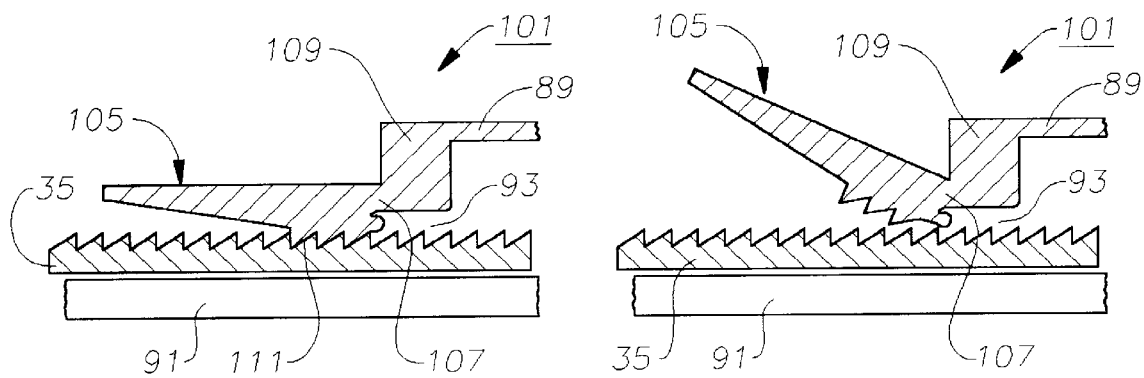
FIG. 8 is an enlarged sectional side view of the apparatus and card of FIG. 7 shown with the card fully inserted and engaged.
FIG. 9 is an enlarged sectional side view of the apparatus and card of FIG. 7 shown with the card fully inserted and disengaged.

Referring now to FIGS. 7–9, a second embodiment of the invention is shown. A retention mechanism 81 is rigidly mounted to the frame 83 of a computer with fasteners 85 (indicated by dashed lines). Mechanism 81 comprises an elongated channel 87 having an upper panel 89, a lower panel 91 and a shallow card guide groove or slot 93 therebetween. Panels 89, 91 are generally parallel to one another.

Channel 87 has a pinching device 101 integrally formed on one end. As shown in FIGS. 8 and 9, pinching device 101 has a finger 105 joined by a flexible web 107 to an integral bracket 109 depending from upper panel 89. Web 107 is rigid but flexible and, thus, biases finger 105 to an engaged position (FIG. 8). Finger 105 extends generally horizontally from bracket 109 and parallel to panel 89. Web 107 acts as a hinge or pivot point for finger 105. Finger 105 may be pivoted between the engaged position and a disengaged position (FIG. 9) by applying an upward directed force to finger 105. A portion of the lower surface of finger 105 adjacent to web 107 has a series of shallow teeth or grooves 111.

Referring again to FIG. 7, forward edge 35 of card 11 has a mechanical enhancement comprising a plurality of shallow teeth or grooves 113 on an upper side. Grooves 113 extend across the width of forward edge 35 and are generally parallel to grooves 111 on finger 105. Grooves 113 may be molded into forward edge 35 or added by applying a thin serrated strip (not shown) to its upper side. As shown in FIG. 8, grooves 113 are provided for mating engagement with grooves 111.

As shown in FIGS. 8 and 9, grooves 111 and 113 are oriented so that card 11 is allowed to ratchet into retention mechanism 101 (right to left) without manual manipulation of finger 105. However, finger 105 must be pivoted to the disengaged position to withdraw card 11 (left to right) from retention mechanism 101.

In operation, the leading edge 11a of card 11 is positioned adjacent to retention mechanism 81 so that forward edge 35 is aligned between panels 89, 91. Forward edge 35 is then inserted into slot 93 (from right to left in FIG. 7) until the electrical connector 18 on the leading edge 11a engages the motherboard connector 84 (indicated schematically by dashed lines). As shown in FIG. 9, finger 105 will ratchet or pivot up and out of the way of forward edge 35 as forward edge 35 enters slot 93 due to interference between grooves 111, 113. When card 11 is properly positioned, grooves 111, 113 will matingly engage, thereby allowing finger 105 to return to its locked position (FIG. 8). With finger 105 in the engaged position, forward edge 35 and, thus, card 11 will be prevented from moving out (to the right) of slot 93. To remove card 11 and disconnect electrical connector 18 from motherboard connector 84, finger 105 is pivoted slightly upward (FIG. 9) so that grooves 111, 113 disengage. Card 11 may then be removed from slot 93 by pulling it to the right.

The invention has several advantages. The pincher device allows a PCI or ISA adapter card to be mounted in a computer quickly and easily while providing rigid support to their forward edges. Rigid support of the forward edge of the card eliminates movement of the forward edge in the channel during shipping, thereby reducing card disconnects from the motherboard or riser card connector and fretting corrosion at the gold tab connector interface. If a card needs to be removed, the quick-release tab on the pinching device is lifted and the card is pulled out of the channel.

While the invention has been shown or described in only some of its forms, it should be apparent to those skilled in the art that it is not so limited, but is susceptible to various changes without departing from the scope of the invention.

We claim:

1. An apparatus for retaining a card in a computer having a frame, the card having an electrical connector for engaging a motherboard connector in the computer, the card also having two oppositely facing sides and a first edge, the apparatus comprising:

a brace adapted to be mounted to the frame for receiving the first edge of the card; and an engagement device pivotally mounted adjacent to the brace for movement in a plane perpendicular to the brace, and having an engaged position for clamping one of the sides adjacent to the first edge of the card against the brace, and a disengaged position for releasing said one of the sides adjacent to the first edge of the card so that the electrical connector may disengage the motherboard connector.

2. The apparatus of claim 1 wherein the brace is a strip having first and second ends.

3. The apparatus of claim 1 wherein the brace is a channel having two spaced apart parallel panels for receiving the sides and first edge of the card therebetween.

4. The apparatus of claim 1 wherein the engagement device comprises a finger for pivotally engaging and capturing said one of the sides of the card between the finger and the brace.

5. The apparatus of claim 1 wherein the brace is a channel having two spaced apart parallel panels for receiving therebetween the first edge of the card; and wherein the engagement device comprises a finger which is flexibly mounted to one of the panels for pivotally engaging and capturing said one of the sides of the card between the finger and the other of the panels.

6. The apparatus of claim 1 wherein the engagement device comprises a finger having a frictionally-enhanced surface for pivotally engaging said one of the sides of the card for capturing the card between the finger and the brace.

7. The apparatus of claim 1 wherein the engagement device comprises a finger mounted to the brace by a flexible web.

8. The apparatus of claim 7 wherein the finger is biased to an engaged position by the flexible web.

9. A computer, comprising in combination:

an enclosure having a frame;

a motherboard connector located within the enclosure;

a card having an electrical connector for engaging the motherboard connector, two oppositely facing sides, a first edge and a second edge with a bracket for mounting the second edge to the frame;

a brace mounted to the frame opposite the second edge, the brace having an upper panel and a lower panel which define a slot therebetween for receiving the sides and first edge of the card; and an engagement device mounted to the brace and having an engaged position wherein one of the sides of the card is engaged so that the card is retained from movement in an inserted position in the slot and continuity is maintained between the electrical connector and the motherboard connector, and a disengaged position wherein said one of the sides of the card is disengaged and the card is free to be removed from the slot so that the electrical connector may be disconnected from the motherboard connector.

10. The computer of claim 9 wherein the engagement device comprises a finger for pivotally engaging and capturing said one of the sides of the card between the finger and one of the panels of the brace.

11. The computer of claim 9 wherein the engagement device comprises a finger which is integrally formed and flexibly mounted to one of the panels with a flexible web for pivotally engaging and capturing said one of the sides of the card between the finger and the other of the panels.

12. The computer of claim 9 wherein the engagement device comprises a finger having a frictionally-enhanced surface for pivotally engaging said one of the sides of the card for capturing the card between the finger and one of the panels of the brace.

13. The computer of claim 9 wherein said one of the sides of the card has a frictionally-enhanced surface that is engaged and disengaged by the engagement device as it is moved between the engaged and disengaged positions, respectively.

14. A computer, comprising:

an enclosure having a frame;

a motherboard connector located within the enclosure;

a card having an electrical connector for engaging the motherboard connector, and a first edge and a second edge with a bracket fastened to the second edge for mounting the second edge to the frame;

a frictionally-enhanced surface on the first edge;

a brace mounted to the frame opposite the second edge, the brace having an upper panel and a lower panel which define a slot therebetween for receiving the first edge of the card;

an engagement device mounted to the brace and having an engaged position wherein the frictionally-enhanced surface on the first edge of the card is engaged so that the card is retained from movement in an inserted position in the slot and continuity is maintained between the electrical connector and the motherboard connector, and a disengaged position wherein the frictionally-enhanced surface on the first edge of the card is disengaged and the card is free to be removed from the slot so that the electrical connector may be disconnected from the motherboard connector; and wherein the frictionally-enhanced surface on the first edge comprises teeth; and wherein the engagement device comprises a finger having teeth for pivotally engaging the teeth on the first edge of the card for capturing the card between the finger and one of the panels of the brace.

15. A computer, comprising:

an enclosure having an internal frame;

a motherboard connector located within the enclosure;

a card having an electrical connector for engaging the motherboard connector, and a first edge and a second edge with a bracket fastened to the second edge for mounting the second edge to the frame;

a set of teeth on the first edge of the card;

a channel mounted to the frame opposite the second edge, the channel having an upper panel and a lower panel which define a slot therebetween for receiving the first edge of the card; and a finger having teeth and being pivotally mounted to one of the panels of the channel, the finger being resiliently biased to an engaged position wherein the teeth on the finger engage the teeth on the first edge of the card and the card is retained from movement in an inserted position in the slot, and a disengaged position wherein the teeth on the finger disengage the teeth on the first edge of the card and the card is free to be removed from the slot.

16. The computer of claim 15 wherein the finger is integrally formed and flexibly mounted to one of the panels by a flexible web for pivotally engaging and capturing the first edge of the card between the teeth of the finger and the other of the panels.

* * * * *